(12) United States Patent
Tanaka

(10) Patent No.: US 12,525,516 B2
(45) Date of Patent: Jan. 13, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Atsushi Tanaka, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 663 days.

(21) Appl. No.: 17/903,846

(22) Filed: Sep. 6, 2022

(65) Prior Publication Data

US 2023/0307329 A1  Sep. 28, 2023

(30) Foreign Application Priority Data

Mar. 24, 2022  (JP) .................................. 2022-048217

(51) Int. Cl.
*H01L 23/495* (2006.01)
*H01L 23/00* (2006.01)

(52) U.S. Cl.
CPC .. *H01L 23/49551* (2013.01); *H01L 23/49524* (2013.01); *H01L 23/49575* (2013.01); *H01L 24/29* (2013.01); *H01L 2224/291* (2013.01)

(58) Field of Classification Search
CPC ......... H01L 23/49551; H01L 23/49524; H01L 23/49575; H01L 23/49562; H01L 23/495;

(Continued)

(56) References Cited

U.S. PATENT DOCUMENTS 5,057,460 A 10/1991 Rose
2010/0270992 A1 10/2010 Kawashima et al.
(Continued)

FOREIGN PATENT DOCUMENTS

JP  S60-58647 A  4/1985
JP  H08-17993 A  1/1996
(Continued)

OTHER PUBLICATIONS

Notice of Reasons for Refusal (Office Action) dated Feb. 12, 2025 in corresponding Japanese Patent Application No. 2022-048217 with English machine translation (10 pages).

*Primary Examiner* — Julio J Maldonado
*Assistant Examiner* — Stanetta D Isaac
(74) *Attorney, Agent, or Firm* — Kim & Stewart LLP

(57) ABSTRACT

According to one embodiment, a semiconductor device includes: a first frame; a first chip on the first frame; a second frame spaced apart from the first frame in a first direction; a second chip on the second frame; and a first joint terminal above the second chip. The first frame includes a first terminal portion extending toward the second frame. The first joint terminal includes a second terminal portion extending toward the first frame. The second terminal portion includes first and second projecting portions each of which projects toward the first frame and which are spaced apart from each other in a second direction. An end portion of the first projecting portion and an end portion of the second projecting portion are each joined on the first terminal portion.

15 Claims, 16 Drawing Sheets

(58) Field of Classification Search
CPC .. H01L 24/29; H01L 2224/291; H01L 23/293
See application file for complete search history.

(56) References Cited

U.S. PATENT DOCUMENTS

| | | | |
|---|---|---|---|
| 2011/0233746 A1* | 9/2011 | Liu | ............... H01L 24/73 |
| | | | 257/676 |
| 2012/0001342 A1 | 1/2012 | Sato et al. | |
| 2015/0206830 A1 | 7/2015 | Takada et al. | |
| 2016/0225690 A1 | 8/2016 | Kadoguchi et al. | |
| 2018/0331021 A1 | 11/2018 | Qin et al. | |

FOREIGN PATENT DOCUMENTS

| | | |
|---|---|---|
| JP | 2795937 B2 | 9/1998 |
| JP | 2002-076230 A | 3/2002 |
| JP | 2010067755 A | 3/2010 |
| JP | 2010258366 A | 11/2010 |
| JP | 2011142172 A | 7/2011 |
| JP | 2015053343 A | 3/2015 |
| JP | 2019087669 A | 6/2019 |
| WO | 2014045435 A1 | 3/2014 |

* cited by examiner

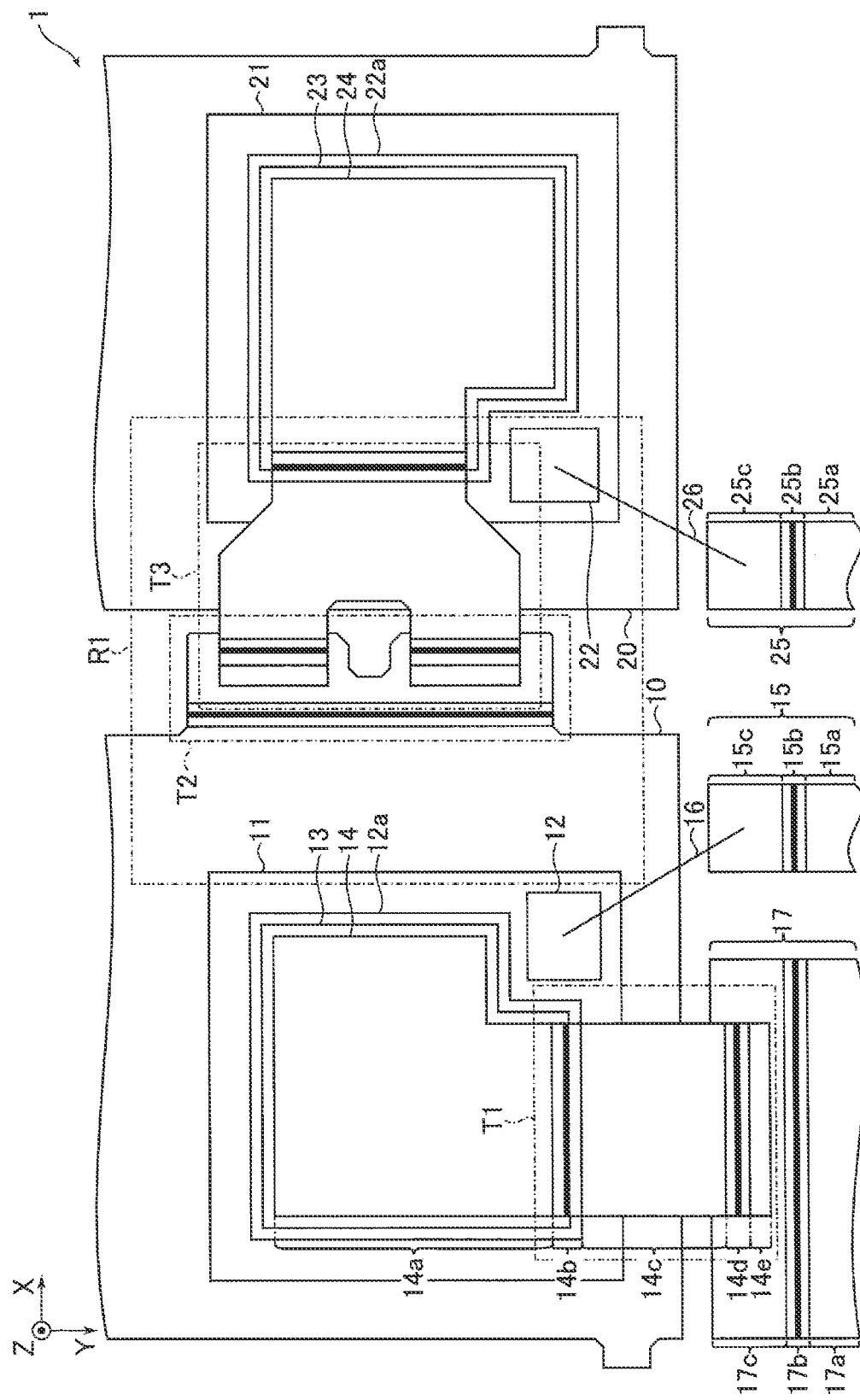
F I G. 2

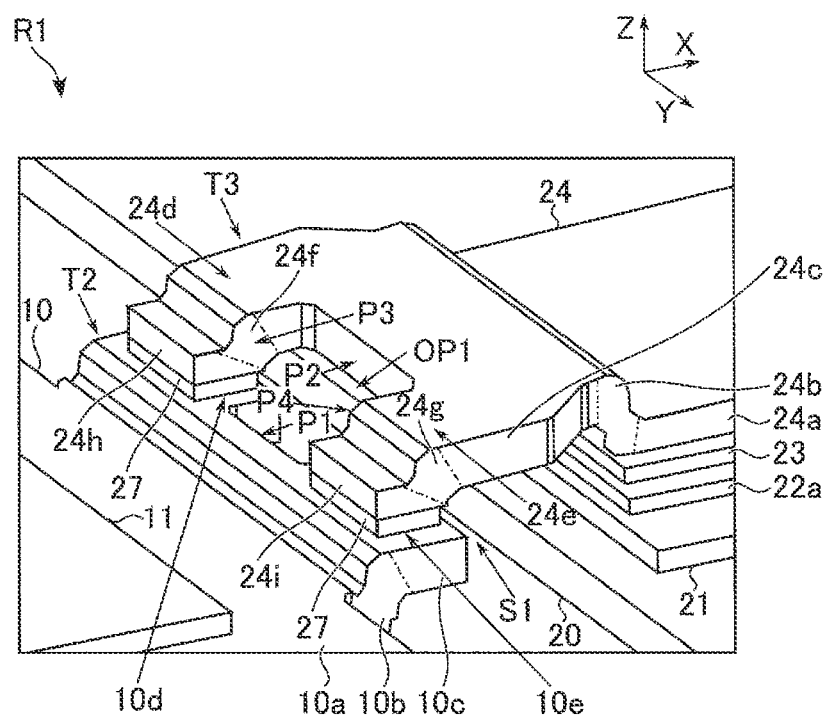
F I G. 4

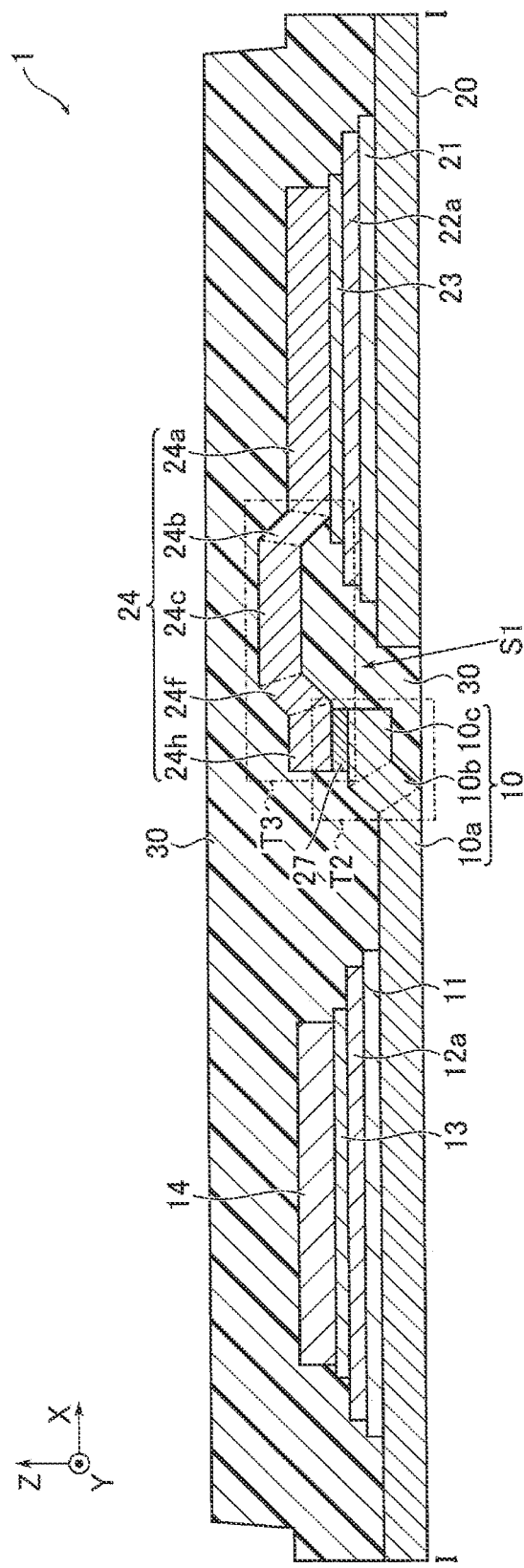
F I G. 5

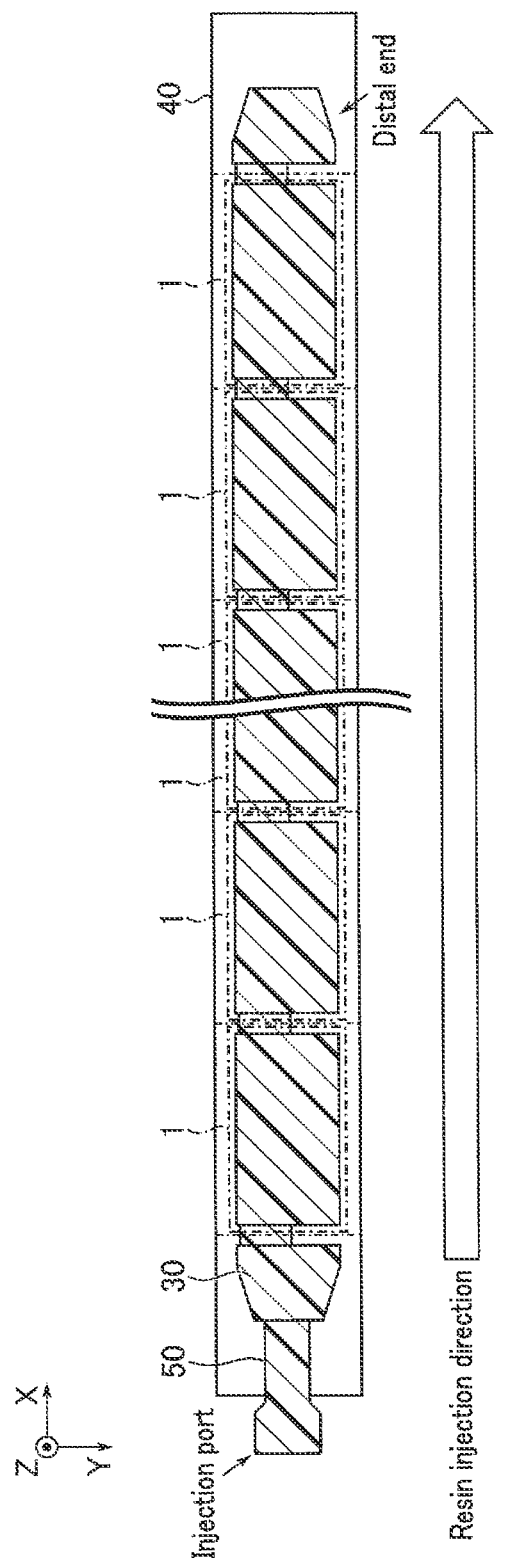
F I G. 6

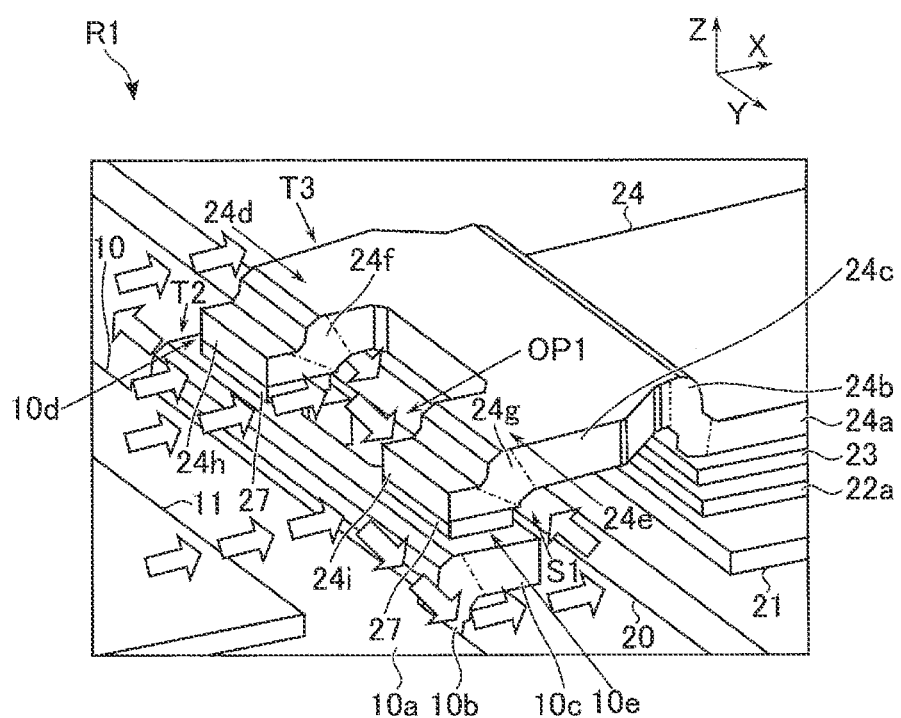
F I G. 7

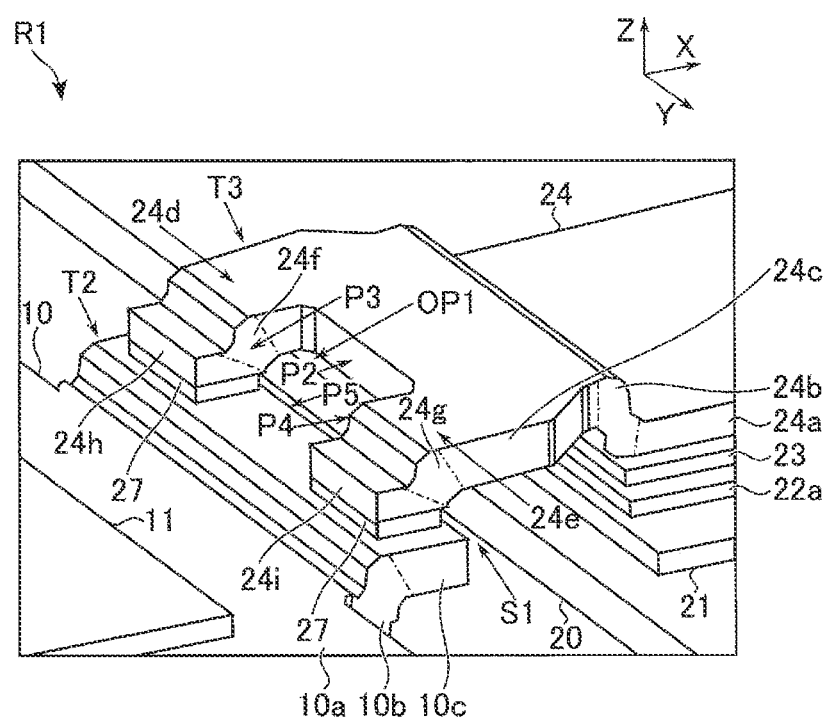
F I G. 8

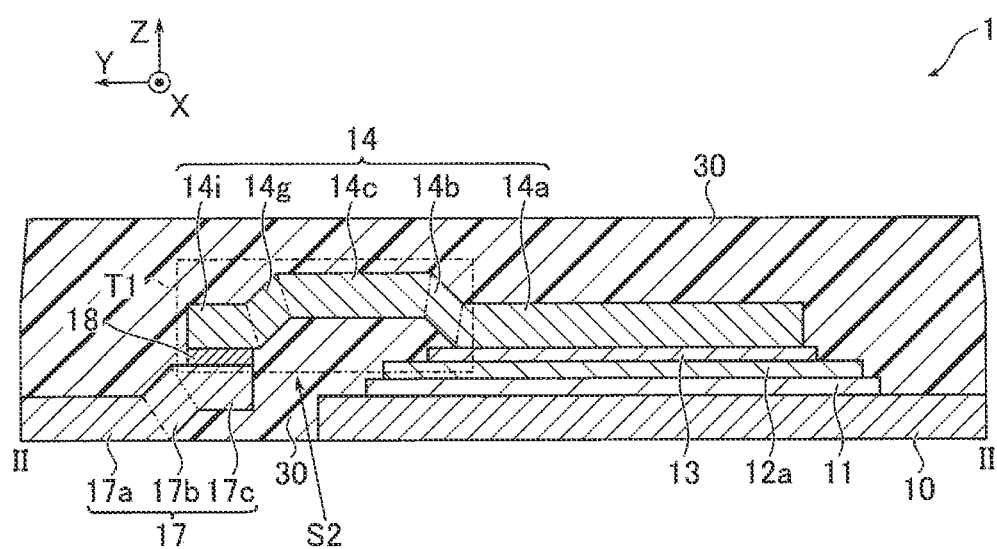
F I G. 14

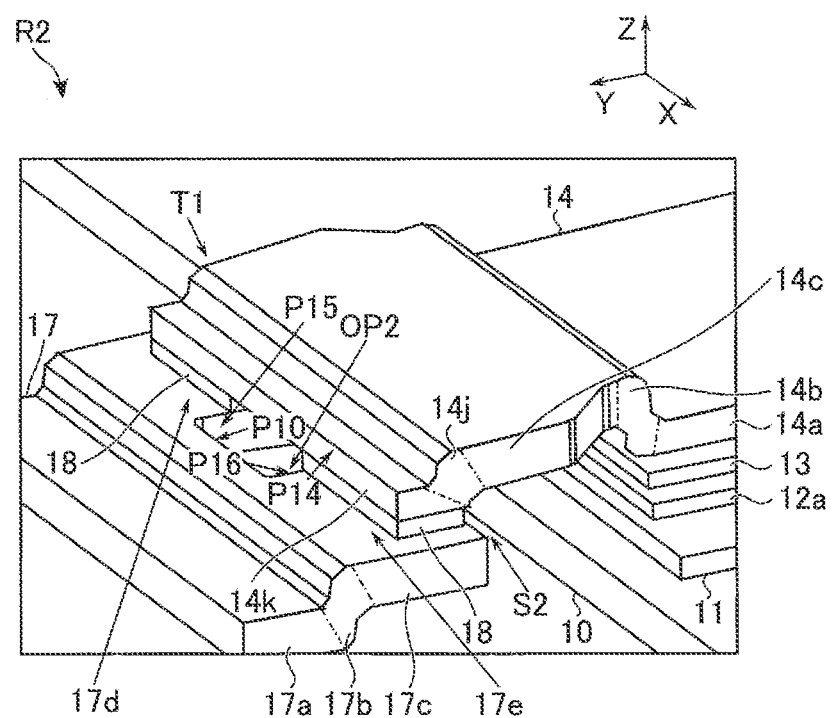
F I G. 16

SEMICONDUCTOR DEVICE

CROSS-REFERENCE TO RELATED APPLICATIONS

This application is based upon and claims the benefit of priority from Japanese Patent Application No. 2022-048217, filed Mar. 24, 2022, the entire contents of which are incorporated herein by reference.

FIELD

Embodiments described herein relate generally to a semiconductor device.

BACKGROUND

A semiconductor device using a lead frame is known.

BRIEF DESCRIPTION OF THE DRAWINGS

FIG. 2 is a plan view showing an example of an internal configuration of the semiconductor device according to the first embodiment.

FIG. 4 is a perspective view showing some of the internal configuration of the semiconductor device according to the first embodiment.

FIG. 5 is a cross-sectional view showing an example of a cross-sectional structure of the semiconductor device according to the first embodiment.

FIG. 6 is a diagram illustrating a formation process of a resin in a manufacturing process of the semiconductor device according to the first embodiment.

FIG. 7 is a diagram illustrating a flow of the resin during its formation in the manufacturing process of the semiconductor device according to the first embodiment.

FIG. 8 is a perspective view showing some of an internal configuration of a semiconductor device according to a first modification of the first embodiment.

FIG. 14 is a cross-sectional view showing an example of a cross-sectional structure of the semiconductor device according to the second embodiment.

FIG. 16 is a perspective view showing some of an internal configuration of a semiconductor device according to a second modification of the second embodiment.

DETAILED DESCRIPTION

Figure 1:
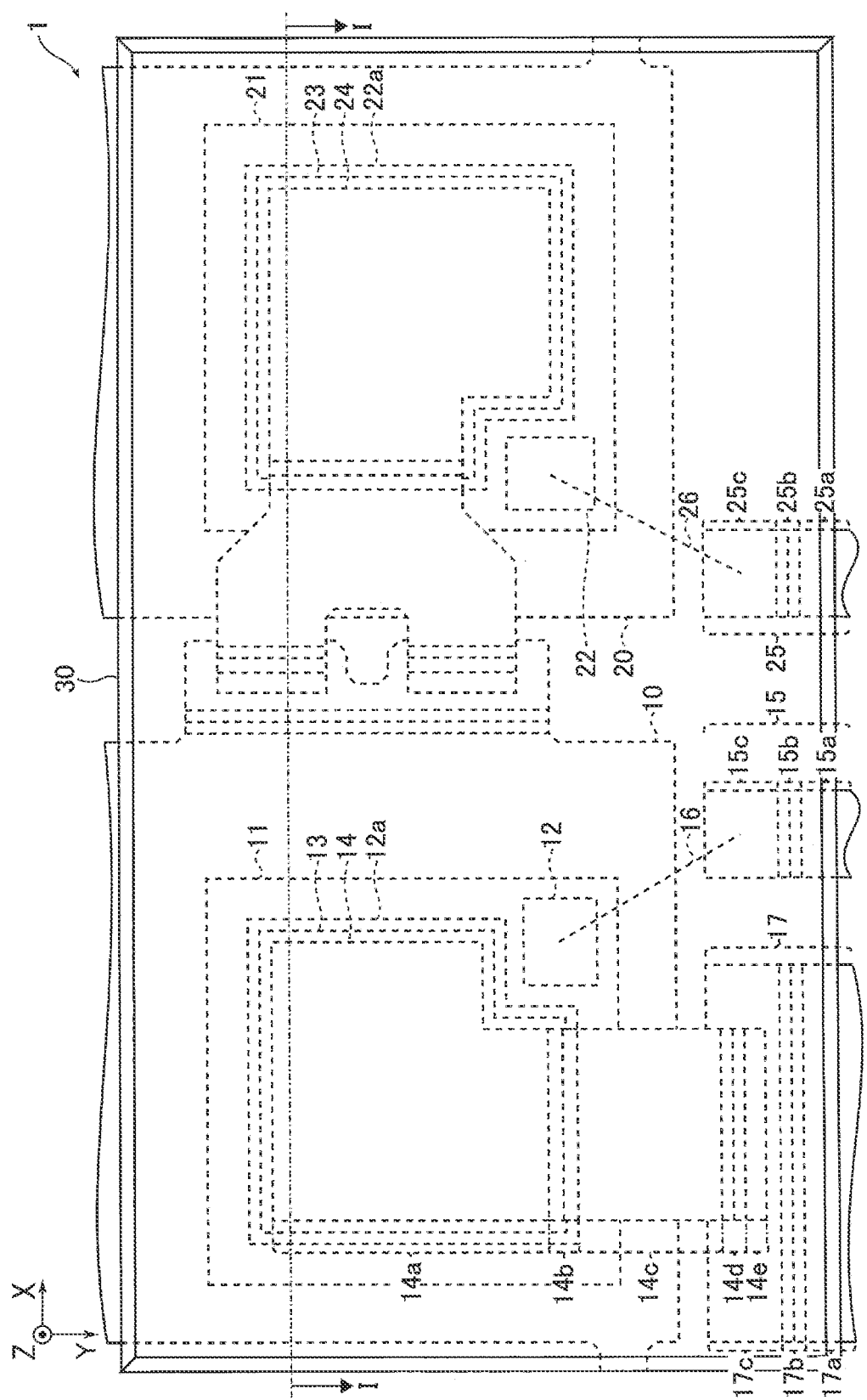
FIG. 1 is a plan view showing an example of a configuration of a semiconductor device according to a first embodiment.

In general, according to one embodiment, a semiconductor device includes: a first frame; a first chip provided on the first frame; a second frame spaced apart from the first frame in a first direction; a second chip provided on the second frame; and a first joint terminal provided above the second chip and electrically coupled to the second chip. The first frame includes a first terminal portion extending toward the second frame. The first joint terminal includes a second terminal portion extending toward the first frame. The second terminal portion includes a first projecting portion and a second projecting portion each of which projects toward the first frame and which are spaced apart from each other in a second direction intersecting the first direction. An end portion of the first projecting portion and an end portion of the second projecting portion are each joined on the first terminal portion.

Hereinafter, embodiments will be described with reference to the accompanying drawings. In the following description, constituent elements having substantially the same function and configuration will be assigned the same reference numeral or symbol and repetitive descriptions may be omitted. All of the descriptions of an embodiment are applicable as descriptions of another embodiment, unless explicitly or self-evidently excluded.

1. FIRST EMBODIMENT

A semiconductor device according to a first embodiment will be described. Hereinafter, a semiconductor device using a lead frame will be described as an example. The semiconductor device is used for, e.g., a transistor package.

1.1 Configuration of Semiconductor Device

The configuration of the semiconductor device according to the present embodiment will be described with reference to FIG. 1 and FIG. 2. FIG. 1 is a plan view showing an example of a configuration of a semiconductor device. In the example shown in FIG. 1, a resin is indicated by the solid line. The internal constituent elements covered with the resin are indicated by the broken line. The outside of the resin (a part not covered with the resin) is indicated by the solid line. FIG. 2 is a plan view showing an example of the internal configuration of the semiconductor device. The example shown in FIG. 2 omits the resin.

As shown in FIG. 1, a semiconductor device 1 includes a lead frame 10, a chip 11, an electrode 12, an electrode 12a, a joint member 13, a joint terminal 14, an electrode terminal 15, an interconnect 16, an electrode terminal 17, a lead frame 20, a chip 21, an electrode 22, an electrode 22a, a joint member 23, a joint terminal 24, an electrode terminal 25, an interconnect 26, and a resin 30. In the following description, an X direction is substantially parallel to a surface of the lead frame 10 and corresponds to, for example, a direction from the lead frame 10 to the lead frame 20 (the direction from the electrode terminal 17 to the electrode terminal 15). A Y direction is substantially parallel to the surface of the lead frame 10 and corresponds to, for example, a direction from the lead frame 10 to the electrode terminal 17. A Z direction is substantially perpendicular to the surface of the lead frame 10 and corresponds to a direction from the lead frame 10 to the chip 11.

The resin 30 is, for example, an epoxy resin. Part of the lead frame 10, all of the chip 11, all of the electrode 12, all of the electrode 12a, all of the joint member 13, all of the joint terminal 14, part of the electrode terminal 15, all of the interconnect 16, part of the electrode terminal 17, part of the lead frame 20, all of the chip 21, all of the electrode 22, all of the electrode 22a, all of the joint member 23, all of the joint terminal 24, part of the electrode terminal 25, and all of the interconnect 26 are covered with the resin 30.

As shown in FIG. 2, the lead frame 10 is a frame configured to support and fix the chip 11. The lead frame 10 is, for example, a drain electrode. The lead frame 10 is formed into, for example, a plate shape. The end far from the electrode terminal 17 of ends in the Y direction of the lead frame 10 extends in the Y direction. The lead frame 10 is formed of a conductive material and may be, for example, a metal material. The lead frame 10 will be described later in detail.

The chip 11 is, for example, an integrated circuit (IC) chip. The chip 11 is provided on the lead frame 10.

The electrode 12 is, for example, a gate electrode. The electrode 12 is provided on the chip 11. The electrode 12 is formed of a conductive material and may be, for example, a metal material. The electrode 12 may include, for example, a joint terminal.

The electrode 12a is, for example, a source electrode. The electrode 12a is formed into, for example, a substantially letter L shape when viewed from a top (when viewed from the top of the drawing sheet of FIG. 2). The electrode 12a is provided on the chip 11. The electrode 12a is formed of a conductive material and may be, for example, a metal material.

The joint member 13 is, for example, a solder joint. The joint member 13 is formed into, for example, a substantially letter L shape when viewed from the top. The joint member 13 is provided on the electrode 12a. The joint member 13 electrically couples the electrode 12a to the joint terminal 14.

The joint terminal 14 electrically couples, for example, the electrode 12a to the electrode terminal 17. The joint terminal 14 is formed into, for example, a substantially letter L shape when viewed from the top. The joint terminal 14 is provided on the joint member 13. The joint terminal 14 is electrically coupled to the chip 11 with the joint member 13 and the electrode 12a intervening therebetween. The joint terminal 14 is formed of a conductive material and may be, for example, a metal material. The joint terminal 14 will be described later in detail.

The electrode terminal 15 is, for example, a gate terminal. The electrode terminal 15 is spaced apart from the lead frame 10 in the Y direction. The end far from the lead frame 10 of ends in the Y direction of the electrode terminal 15 extends in the Y direction. The electrode terminal 15 is formed of a conductive material and may be, for example, a metal material.

The electrode terminal 15 includes a base portion 15a, a bending portion 15b, and a joint portion 15c. For example, the electrode terminal 15 is bent upward on the boundary between the base portion 15a and the bending portion 15b, and is bent in the Y direction on the boundary between the bending portion 15b and the joint portion 15c. The surface of the base portion 15a and the surface of the joint portion 15c are substantially parallel to each other. The surface of the joint portion 15c is positioned above the surface of the base portion 15a. In other words, the electrode terminal 15 has a step in the Y direction.

The interconnect 16 is, for example, a bonding wire. One end of the interconnect 16 is joined to the electrode 12. The other end of the interconnect 16 is joined to the joint portion 15c of the electrode terminal 15. The interconnect 16 electrically couples the electrode 12 to the electrode terminal 15. The interconnect 16 is formed of a conductive material and may be, for example, a metal material. In the case of the electrode 12 having a joint terminal, the joint terminal of the electrode 12, instead of the interconnect 16, may be electrically coupled to the electrode terminal 15.

The electrode terminal 17 is, for example, a source terminal. The electrode terminal 17 is spaced apart from the electrode terminal 15 in the X direction. The electrode terminal 17 is spaced apart from the lead frame 10 in the Y direction. The end far from the lead frame 10 of ends in the Y direction of the electrode terminal 17 extends in the Y direction. The electrode terminal 17 is formed of a conductive material and may be, for example, a metal material.

The electrode terminal 17 includes a base portion 17a, a bending portion 17b, and a joint portion 17c. For example, the electrode terminal 17 is bent upward on the boundary between the base portion 17a and the bending portion 17b, and is bent in the Y direction on the boundary between the bending portion 17b and the joint portion 17c. The surface of the base portion 17a and the surface of the joint portion 17c are substantially parallel to each other. The surface of the joint portion 17c is positioned above the surface of the base portion 17a. In other words, the electrode terminal 17 has a step in the Y direction.

The lead frame 20 is a frame configured to support and fix the chip 21. The lead frame 20 is, for example, a drain electrode. The lead frame 20 is formed into, for example, a plate shape. The lead frame 20 is spaced apart from the lead frame 10 in the X direction. The end far from the electrode terminal 25 of ends in the Y direction of the lead frame 20 extends in the Y direction. The lead frame 20 is formed of a conductive material and may be, for example, a metal material.

The chip 21 is, for example, an IC chip. The chip 21 is provided on the lead frame 20.

The electrode 22 is, for example, a gate electrode. The electrode 22 is provided on the chip 21. The electrode 22 is formed of a conductive material and may be, for example, a metal material. The electrode 22 may include, for example, a joint terminal.

The electrode 22a is, for example, a source electrode. The electrode 22a is formed into, for example, a substantially letter L shape when viewed from the top. The electrode 22a is provided on the chip 21. The electrode 22a is formed of a conductive material and may be, for example, a metal material.

The joint member 23 is, for example, a solder joint. The joint member 23 is formed into, for example, a substantially letter L shape when viewed from the top. The joint member 23 is provided on the electrode 22a. The joint member 23 electrically couples the electrode 22a to the joint terminal 24.

The joint terminal 24 electrically couples, for example, the electrode 22a to the lead frame 10. The joint terminal 24 is formed into, for example, a substantially letter L shape when viewed from the top. The joint terminal 24 is provided on the joint member 23. The joint terminal 24 is electrically coupled to the chip 21 with the joint member 23 and the electrode 22a intervening therebetween. The joint terminal 24 is formed of a conductive material and may be, for example, a metal material. The joint terminal 24 will be described later in detail.

The electrode terminal 25 is, for example, a gate terminal. The electrode terminal 25 is spaced apart from the electrode terminal 15 in the X direction. The electrode terminal 25 is spaced apart from the lead frame 20 in the Y direction. The end far from the lead frame 20 of ends in the Y direction of the electrode terminal 25 extends in the Y direction. The electrode terminal 25 is formed of a conductive material and may be, for example, a metal material.

The electrode terminal 25 includes a base portion 25a, a bending portion 25b, and a joint portion 25c. For example, the electrode terminal 25 is bent upward on the boundary between the base portion 25a and the bending portion 25b, and is bent in the Y direction on the boundary between the bending portion 25b and the joint portion 25c. The surface of the base portion 25a and the surface of the joint portion 25c are substantially parallel to each other. The surface of the joint portion 25c is positioned above the surface of the base portion 25a. In other words, the electrode terminal 25 has a step in the Y direction.

The interconnect 26 is, for example, a bonding wire. One end of the interconnect 26 is joined to the electrode 22. The other end of the interconnect 26 is joined to the joint portion 25c of the electrode terminal 25. The interconnect 26 electrically couples the electrode 22 to the electrode terminal 25. The interconnect 26 is formed of a conductive material and may be, for example, a metal material. In the case of the electrode 22 having a joint terminal, the joint terminal of the electrode 22, instead of the interconnect 26, may be electrically coupled to the electrode terminal 25.

The joint terminal 14 will be described in detail with reference to FIG. 2.

As shown in FIG. 2, the joint terminal 14 includes a base portion 14a and a terminal portion T1. The terminal portion T1 is positioned on a side close to the electrode terminal 17 in the Y direction of the joint terminal 14. The terminal portion T1 is formed into, for example, a substantially rectangular shape when viewed from the top. The terminal portion T1 includes a bending portion 14b, a bridge portion 14c, a bending portion 14d, and a joint portion 14e.

For example, the joint terminal 14 is bent upward on the boundary between the base portion 14a and the bending portion 14b, and is bent in the Y direction on the boundary between the bending portion 14b and the bridge portion 14c. For example, the joint terminal 14 is bent downward on the boundary between the bridge portion 14c and the bending portion 14d, and is bent in the Y direction on the boundary between the bending portion 14d and the joint portion 14e. The surface of the base portion 14a, the surface of the bridge portion 14c, and the surface of the joint portion 14e are substantially parallel to each other. The surface of the bridge portion 14c is positioned above the surface of the base portion 14a and the surface of the joint portion 14e. In other words, the joint terminal 14 has a step in the Y direction.

As shown in FIG. 2, the terminal portion T1 is provided on the electrode terminal 17. More specifically, the joint portion 14e of the joint terminal 14 is joined on the joint portion 17c of the electrode terminal 17. This electrically couples the terminal portion T1 to the electrode terminal 17. In other words, the joint terminal 14 is electrically coupled to the electrode terminal 17 with the terminal portion T1 intervening therebetween.

Figure 3:
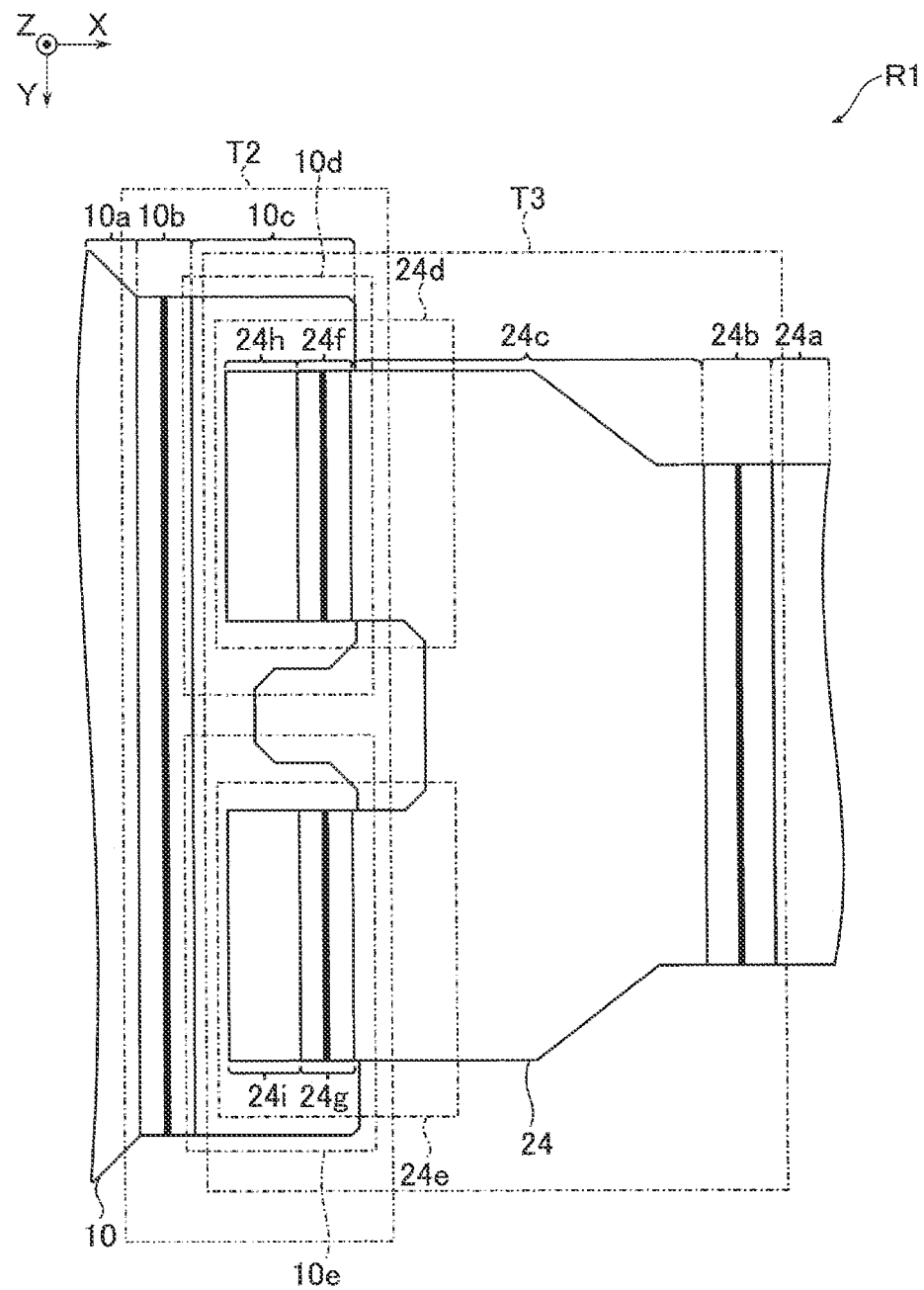
FIG. 3 is an enlarged view showing some of the internal configuration of the semiconductor device according to the first embodiment.

The lead frame 10 will be described in detail with reference to FIG. 3. FIG. 3 is an enlarged view showing some of the internal configuration of the semiconductor device 1 (the enlarged view of the region R1 in FIG. 2). The example shown in FIG. 3 omits the chips 11 and 21, the electrodes 22 and 22a, and the joint member 23.

As shown in FIG. 3, the lead frame 10 includes a base portion 10a and a terminal portion T2. The terminal portion T2 is positioned on a side close to the joint terminal 24 (close to the lead frame 20) in the X direction of the lead frame 10. The terminal portion T2 extends toward the joint terminal 24. The terminal portion T2 is formed into, for example, a substantially letter U shape when viewed from the top. The terminal portion T2 includes a bending portion 10b and a joint portion 10c.

For example, the lead frame 10 is bent upward on the boundary between the base portion 10a and the bending portion 10b, and is bent in the X direction on the boundary between the bending portion 10b and the joint portion 10c. The surface of the base portion 10a and the surface of the joint portion 10c are substantially parallel to each other. The surface of the joint portion 10c is positioned above the surface of the base portion 10a. In other words, the lead frame 10 has a step in the X direction.

The terminal portion T2 includes projecting portions 10d and 10e each of which projects toward the joint terminal 24 (the lead frame 20). In other words, the end close to the joint terminal 24 of ends in the X direction of the terminal portion T2 is divided into two parts. The projecting portion 10d and the projecting portion 10e are spaced apart from each other in the Y direction. The terminal portion T2 may include three or more projecting portions. In this case, these projecting portions are spaced apart from each other in the Y direction.

The joint terminal 24 will be described in detail with reference to FIG. 3.

As shown in FIG. 3, the joint terminal 24 includes a base portion 24a and a terminal portion T3. The terminal portion T3 is positioned on a side close to the lead frame 10 in the X direction of the joint terminal 24. The terminal portion T3 extends toward the lead frame 10. The terminal portion T3 is formed into, for example, a substantially letter Y shape when viewed from the top. The terminal portion T3 includes a bending portion 24b, a bridge portion 24c, bending portions 24f and 24g, and joint portions 24h and 24i.

For example, the joint terminal 24 is bent upward on the boundary between the base portion 24a and the bending portion 24b, and is bent in the X direction on the boundary between the bending portion 24b and the bridge portion 24c. For example, the joint terminal 24 is bent downward on the boundary between the bridge portion 24c and the bending portion 24f, and is bent in the X direction on the boundary between the bending portion 24f and the joint portion 24h. For example, the joint terminal 24 is bent downward on the boundary between the bridge portion 24c and the bending portion 24g, and is bent in the X direction on the boundary between the bending portion 24g and the joint portion 24i. The surface of the base portion 24a, the surface of the bridge portion 24c, the surface of the joint portion 24h, and the surface of the joint portion 24i are substantially parallel to each other. The surface of the bridge portion 24c is positioned above the surface of the base portion 24a, the surface of the joint portion 24h, and the surface of the joint portion 24i. In other words, the joint terminal 24 has a step in the X direction.

The terminal portion T3 includes projecting portions 24d and 24e each of which projects toward the lead frame 10. In other words, the end close to the lead frame 10 of ends in the X direction of the terminal portion T3 is divided into two parts. Projecting portions 24d and 24e are spaced apart from each other in the Y direction. The projecting portion 24d includes part of the bridge portion 24c, all of the bending portion 24f, and all of the joint portion 24h. The projecting portion 24e includes part of the bridge portion 24c, all of the bending portion 24g, and all of the joint portion 24i. The terminal portion T3 may include three or more projecting portions. In this case, these projecting portions are spaced apart from each other in the Y direction.

As shown in FIG. 3, the terminal portion T3 is provided on the terminal portion T2. More specifically, the joint portion 24h of the terminal portion T3 is joined on the joint portion 10c of the terminal portion T2. The joint portion 24i of the terminal portion T3 is joined on the joint portion 10c of the terminal portion T2. In other words, the end portion of the projecting portion 24d of the terminal portion T3 is joined on the projecting portion 10d of the terminal portion T2. The end portion of the projecting portion 24e of the terminal portion T3 is joined on the projecting portion 10e of the terminal portion T2. That is, the terminal portion T3 and the terminal portion T2 are joined together via two joint surfaces. Hereinafter, a combination of the joint surfaces, the end portion of the terminal portion T2 in contact with the joint surfaces, and the end portion of the terminal portion T3 in contact with the joint surfaces will be referred to as a "joint part". This electrically couples the terminal portion T3 to the terminal portion T2. In other words, the joint terminal 24 is electrically coupled to the lead frame 10 with the terminal portions T3 and T2 intervening therebetween.

For example, the lead frame 10, the electrode terminals 15 and 17, the lead frame 20, and the electrode terminal 25 shown in FIG. 2 correspond to part of a lead frame (not shown), and also correspond to the remainder of the lead frame (not shown) cut and removed through a manufacturing process.

FIG. 4 is a perspective view showing some of the internal configuration of the semiconductor device 1 (the perspective view of the region R1 in FIG. 2). The example shown in FIG. 4 omits the electrode 22.

As shown in FIG. 4, the end portion of the projecting portion 24d is provided on the projecting portion 10d. The end portion of the projecting portion 24d is joined to the projecting portion 10d via the joint member 27 formed on the upper surface of the projecting portion 10d. The joint member 27 is, for example, a solder joint. The joint member 27 electrically couples the terminal portion T2 to the terminal portion T3. The end portion of the projecting portion 24e is provided on the projecting portion 10e. The end portion of the projecting portion 24e is joined to the projecting portion 10e via a joint member 27 formed on the upper surface of the projecting portion 10e.

An end surface of the terminal portion T3 (the surface of the terminal portion T3, the surface being sandwiched between the projecting portions 24d and 24e and facing the lead frame 10 (this surface will be also referred to as a "surface P2")) is positioned closer to the lead frame 20 as compared to an end surface of the terminal portion T2 (the surface of the terminal portion T2, the surface being sandwiched between the projecting portions 10d and 10e and facing the lead frame 20 (this surface will also be referred to as a "surface P1")).

With the above structure, an upper part of a space (hereinafter, also referred to as a "space S1") surrounded by the terminal portion T2, the joint member 27, the terminal portion T3, the joint member 23, the electrode 22a, the chip 21, and the lead frame 20 is not blocked by the terminal portions T2 and T3. While the projecting portion 24d has a surface which faces the projecting portion 24e and is referred to as a "surface P3" and the projecting portion 24e has a surface which faces the projecting portion 24d and is referred to as a "surface P4", the semiconductor device 1 has a region surrounded by the surfaces P1, P2, P3, and P4. In other words, the terminal portions T2 and T3 (the projecting portions 10d, 10e, 24d, and 24e) form an opening (hereinafter, also referred to as an "opening OP1"). That is, the semiconductor device 1 has the opening OP1 formed by the terminal portions T2 and T3. A region surrounded by the surfaces P1, P2, P3, and P4 corresponds to the opening OP1. Both ends in the Y direction of the space S1 are not blocked.

A cross-sectional structure of the semiconductor device 1 will be described with reference to FIG. 5. FIG. 5 is a cross-sectional view (the cross-sectional view taken along the line I-I in FIG. 1) showing an example of a structure of the semiconductor device 1.

As shown in FIG. 5, the bending portion 10b enables the lead frame 10 to be bent in such a manner that the surface of the joint portion 10c is positioned above the surface of the base portion 10a. The chip 11 is provided on the lead frame 10. The electrode 12a is provided on the chip 11. The joint member 13 is provided on the electrode 12a. The joint terminal 14 is provided on the joint member 13.

The chip 21 is provided on the lead frame 20. The electrode 22a is provided on the chip 21. The joint member 23 is provided on the electrode 22a. The joint terminal 24 is provided on the joint member 23. The bending portions 24b and 24f enable the joint terminal 24 to be bent in such a manner that the surface of the bridge portion 24c is positioned above the surface of the base portion 24a and the surface of the joint portion 24h.

The joint portion 24h is provided on the joint portion 10c. The joint portion 24h is joined to the joint portion 10c via the joint member 27.

The lead frame 10, the chip 11, the electrode 12a, the joint member 13, the joint terminal 14, the lead frame 20, the chip 21, the electrode 22a, the joint member 23, and the joint terminal 24 are covered with the resin 30. The space S1 is filled with the resin 30.

1.2 Method of Manufacturing Semiconductor Device

A method of manufacturing the semiconductor device 1 will be described. In the present embodiment, a plurality of semiconductor devices 1 are formed using a single lead frame. Before the formation of the resin 30, internal constituent elements (hereinafter, also referred to as "constituent element groups") of the semiconductor device 1 shown in FIG. 2 are arranged in a matrix pattern on the single lead frame. These constituent element groups are sealed with the resin 30. Hereinafter, a formation process of the resin 30 will be described with reference to FIG. 6. FIG. 6 is a diagram illustrating a formation process of the resin 30. The example in FIG. 6 shows a method (the transfer method) of forming the resin 30 using a mold 50 with respect to a plurality of constituent element groups provided in a row in the X direction on the lead frame 40.

As shown in FIG. 6, the resin 30 is injected from an injection port of the mold 50. The resin 30 flows in the X direction (the direction from the left side of the drawing sheet of FIG. 6 toward the right side of the drawing sheet of FIG. 6) from the injection port of the mold 50 to the distal end of the mold 50. By this, the plurality of constituent element groups provided on the lead frame 40 are sealed with the resin 30 between the injection port of the mold 50 and the distal end of the mold 50.

After the formation of the resin 30, the lead frame 40 is cut and removed, thereby resulting in the formation of the plurality of semiconductor devices 1.

A flow of the resin 30 during its formation will be described with reference to FIG. 7. FIG. 7 is a diagram illustrating a flow of the resin 30. In the example shown in FIG. 7, a flow of the resin 30 being injected in order to cover the constituent element groups of the semiconductor device 1 shown in FIG. 2 and heading to the space S1 is indicated by an arrow.

As shown in FIG. 7, the resin 30 is injected from the X direction side (the side close to the lead frame 10). The resin 30 travels by detouring along the outside of the projecting portion 24d to flow into the space S1. The resin 30 travels by detouring along the outside of the projecting portion 24e to flow into the space S1. The resin 30 travels downward through the opening OP1 formed by the terminal portions T2 and T3, and flows into the space S1.

1.3 Advantageous Effect of Present Embodiment

The configuration according to the present embodiment can improve the yield of the semiconductor device. Hereinafter, the advantageous effects will be described.

With the configuration in which the end portion of the terminal portion T3 of the joint terminal 24 is joined on the terminal portion T2 via the joint member 27 formed on the upper surface of the terminal portion T2 of the lead frame 10, a residual stress of the joint member 27 becomes larger as an area of the joint member 27 formed on the upper surface of the terminal portion T2 (the area of the joint member 27 in contact with the terminal portions T2 and T3) increases. For this reason, depending on the area of the joint member 27 formed on the upper surface of the terminal portion T2, the residual stress of the joint member 27 may increase a strain of the joint part between the terminal portion T2 and the terminal portion T3. In addition, peeling between the terminal portion T2 and the terminal portion T3 at the joint part may occur.

On the other hand, in the present embodiment, the terminal portion T2 includes the projecting portions 10d and 10e projecting toward the joint terminal 24. The projecting portion 10d and the projecting portion 10e are spaced apart from each other in the Y direction. The terminal portion T3 includes projecting portions 24d and 24e each of which projects toward the lead frame 10. The projecting portion 24d and the projecting portion 24e are spaced apart from each other in the Y direction.

The end portion of the projecting portion 24d of the terminal portion T3 is joined on the projecting portion 10d via the joint member 27 formed on the upper surface of the projecting portion 10d of the terminal portion T2. Therefore, the area of the joint member 27 formed on the upper surface of the projecting portion 10d is smaller than the area of the joint member 27 that is formed on the upper surface of the terminal portion T2 in the case of the terminal portion T3 having no projecting portion. For this reason, the residual stress of the joint member 27 formed on the upper surface of the projecting portion 10d is smaller than the residual stress of the joint member 27 that is formed on the upper surface of the terminal portion T2 in the case of the terminal portion T3 having no projecting portion.

The end portion of the projecting portion 24e of the terminal portion T3 is joined on the projecting portion 10e via the joint member 27 formed on the upper surface of the projecting portion 10e of the terminal portion T2. Therefore, the area of the joint member 27 formed on the upper surface of the projecting portion 10e is smaller than the area of the joint member 27 that is formed on the upper surface of the terminal portion T2 in the case of the terminal portion T3 having no projecting portion. For this reason, the residual stress of the joint member 27 formed on the upper surface of the projecting portion 10e is smaller than the residual stress of the joint member 27 that is formed on the upper surface of the terminal portion T2 in the case of the terminal portion T3 having no projecting portion.

This can suppress the strain of the joint part between the terminal portions T2 and T3 and also suppress the occurrence of peeling between the terminal portions T2 and T3 at the joint part.

With a configuration in which the terminal portions T2 and T3 extend in the direction in which the resin 30 is injected and the end portion of the terminal portion T3 is joined on the terminal portion T2, the resin 30 travels by detouring along the outside of the terminal portion T3 to flow into the space S1. However, the terminal portions T2 and T3 extending in the direction in which the resin 30 is injected may obstruct the flow of the resin 30, thereby causing a void in the space S1 or resulting in the space S1 not being filled with the resin 30.

On the other hand, in the present embodiment, the end portion of the projecting portion 24d of the terminal portion T3 is provided on the projecting portion 10d of the terminal portion T2. The end portion of the projecting portion 24e of the terminal portion T3 is provided on the projecting portion 10e of the terminal portion T2. The surface P2 of the terminal portion T3, which is the surface which is sandwiched between the projecting portions 24d and 24e and faces the lead frame 10, is positioned closer to the lead frame 20 as compared to the surface P1 of the terminal portion T2, which is the surface which is sandwiched between the projecting portions 10d and 10e and faces the lead frame 20. In other words, the semiconductor device 1 has the opening OP1 formed by the terminal portions T2 and T3. Accordingly, during the formation process of the resin 30, the resin 30 not only travels by detouring along the outside of the projecting portions 24d and 24e to flow into the space S1 but also travels downward through the opening OP1 to flow into the space S1. This can improve the filling property of the resin 30. This enables a resin whose curing time is relatively short to be used as the resin 30, for example.

A difference in elongation due to heat between the terminal portion T2 and the resin 30 becomes larger as an area of the resin 30 covering the terminal portion T2 (the area of the resin 30 in contact with the terminal portion T2) increases. Therefore, depending on the area of the resin 30 covering the terminal portion T2, peeling between the terminal portion T2 and the resin 30 may occur due to heat. With respect to the terminal portion T3, similarly, depending on the area of the resin 30 covering the terminal portion T3 (the area of the resin 30 in contact with the terminal portion T3), peeling between the terminal portion T3 and the resin 30 may occur due to heat.

On the other hand, in the present embodiment, the semiconductor device 1 has the opening OP1 formed by the terminal portions T2 and T3. Accordingly, the area of the resin 30 covering the terminal portion T2 is smaller than the area of the resin 30 that covers the terminal portion T2 in the case of the semiconductor device 1 having no opening. Accordingly, a difference in elongation due to heat between the terminal portion T2 and the resin 30 becomes smaller as compared to such a difference in the case of the semiconductor device 1 having no opening. The area of the resin 30 covering the terminal portion T3 is smaller than the area of the resin 30 that covers the terminal portion T3 in the case of the semiconductor device 1 having no opening. Accordingly, a difference in elongation due to heat between the terminal portion T3 and the resin 30 becomes smaller as compared to such a difference in the case of the semiconductor device 1 having no opening. This can suppress peeling between the terminal portion T2 and the resin 30 and peeling between the terminal portion T3 and the resin 30.

1.4 First Modification

A semiconductor device according to a first modification of the first embodiment will be described. The semiconductor device 1 according to the first modification of the first embodiment differs from that of the first embodiment in terms of a shape of the terminal portion T2 of the lead frame 10. The following will omit a description of a configuration similar to that of the first embodiment and will mainly provide a description of a configuration different from that of the first embodiment.

1.4.1 Configuration of Semiconductor Device

The configuration of the semiconductor device 1 according to the present modification will be described with reference to FIG. 8. FIG. 8 is a perspective view showing some of the internal configuration of the semiconductor device 1 (the view corresponding to FIG. 4 showing the first embodiment). The example shown in FIG. 8 omits the electrode 22.

As shown in FIG. 8, the terminal portion T2 is formed into, for example, a substantially rectangular shape when viewed from the top. The end close to the joint terminal 24 of ends in the X direction of the terminal portion T2 is not divided into two or more parts.

The end portion of the projecting portion 24d is joined on the terminal portion T2. More specifically, the end portion of the projecting portion 24d is joined on the terminal portion T2 via the joint member 27 formed on the upper surface of the terminal portion T2. The end portion of the projecting portion 24e is joined on the terminal portion T2. More specifically, the end portion of the projecting portion 24e is joined on the terminal portion T2 via the joint member 27 formed on the upper surface of the terminal portion T2. That is, the terminal portion T3 and the terminal portion T2 are joined together via two joint surfaces.

An end surface of the terminal portion T3 (the surface P2 of the terminal portion T3, the surface being sandwiched between the projecting portions 24d and 24e and facing the lead frame 10) is positioned closer to the lead frame 20 as compared to an end surface of the terminal portion T2 (the surface of the terminal portion T2, the surface facing the lead frame 20 (this surface will also be referred to as a "surface P5")).

With the above structure, the upper part of the space S1 is not blocked by the terminal portions T2 and T3. The semiconductor device 1 includes a region surrounded by the surfaces P2, P3, P4, and P5. In other words, the terminal portions T2 and T3 (the terminal portion T2 and the projecting portions 24d and 24e) form the opening OP1. That is, the semiconductor device 1 has the opening OP1 formed by the terminal portions T2 and T3. A region surrounded by the surfaces P2, P3, P4, and P5 corresponds to the opening OP1. Both ends in the Y direction of the space S1 are not blocked.

1.4.2 Advantageous Effect of Present Modification

The present modification produces advantageous effects similar to those of the first embodiment.

1.5 Second Modification

A semiconductor device according to a second modification of the first embodiment will be described. The semiconductor device 1 according to the second modification of the first embodiment differs from that of the first embodiment in terms of a shape of the terminal portion T3 of the joint terminal 24. The following will omit a description of a configuration similar to that of the first embodiment and will mainly provide a description of a configuration different from that of the first embodiment.

1.5.1 Configuration of Semiconductor Device

Figure 9:
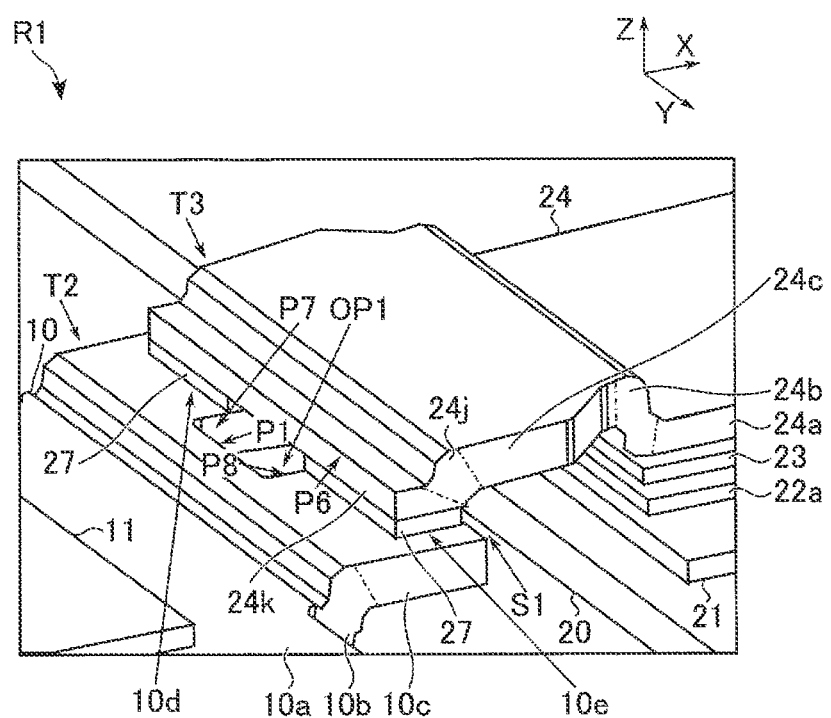
FIG. 9 is a perspective view showing some of an internal configuration of a semiconductor device according to a second modification of the first embodiment.

The configuration of the semiconductor device 1 according to the present modification will be described with reference to FIG. 9. FIG. 9 is a perspective view showing some of the internal configuration of the semiconductor device 1 (the view corresponding to FIG. 4 showing the first embodiment). The example shown in FIG. 9 omits the electrode 22.

As shown in FIG. 9, the terminal portion T3 is formed into, for example, a substantially rectangular shape when viewed from the top. The terminal portion T3 includes the bending portion 24b, the bridge portion 24c, a bending portion 24j, and a joint portion 24k.

For example, the joint terminal 24 is bent upward on the boundary between the base portion 24a and the bending portion 24b, and is bent in the X direction on the boundary between the bending portion 24b and the bridge portion 24c. For example, the joint terminal 24 is bent downward on the boundary between the bridge portion 24c and the bending portion 24j, and is bent in the X direction on the boundary between the bending portion 24j and the joint portion 24k. The surface of the base portion 24a, the surface of the bridge portion 24c, and the surface of the joint portion 24k are substantially parallel to each other. The surface of the bridge portion 24c is positioned above the surface of the base portion 24a and the surface of the joint portion 24k. In other words, the joint terminal 24 has a step in the X direction.

The end close to the lead frame 10 of ends in the X direction of the terminal portion T3 is not divided into two or more parts.

The end portion of the terminal portion T3 is joined on the projecting portion 10d. More specifically, the end portion of the terminal portion T3 is joined on the projecting portion 10d via the joint member 27 formed on the upper surface of the projecting portion 10d. The end portion of the terminal portion T3 is joined on the projecting portion 10e. More specifically, the end portion of the terminal portion T3 is joined on the projecting portion 10e via the joint member 27 formed on the upper surface of the projecting portion 10e. That is, the terminal portion T3 and the terminal portion T2 are joined together via two joint surfaces.

An end surface of the terminal portion T3 (the surface of the terminal portion T3, the surface facing the lead frame 10 (this surface will be also referred to as a "surface P6")) is positioned closer to the lead frame 20 as compared to an end surface of the terminal portion T2 (the surface P1 of the terminal portion T2, the surface being sandwiched between the projecting portions 10d and 10e and facing the lead frame 20).

With the above structure, the upper part of the space S1 is not blocked by the terminal portions T2 and T3. While the projecting portion 10d has a surface which faces the projecting portion 10e and is referred to as a "surface P7" and the projecting portion 10e has a surface which faces the projecting portion 10d and is referred to as a "surface P8", the semiconductor device 1 has a region surrounded by the surfaces P1, P6, P7, and P8. In other words, the terminal portions T2 and T3 (the projecting portions 10d and 10e and the terminal portion T3) form the opening OP1. That is, the semiconductor device 1 has the opening OP1 formed by the terminal portions T2 and T3. A region surrounded by the surfaces P1, P6, P7, and P8 corresponds to the opening OP1. Both ends in the Y direction of the space S1 are not blocked.

1.5.2 Advantageous Effect of Present Modification

The present modification produces advantageous effects similar to those of the first embodiment.

2. SECOND EMBODIMENT

A semiconductor device according to a second embodiment will be described. The semiconductor device 1 according to the second embodiment differs from that of the first embodiment in terms of an internal configuration. The following will omit a description of a configuration similar to that of the first embodiment and will mainly provide a description of a configuration different from that of the first embodiment.

2.1 Configuration of Semiconductor Device

Figure 10:
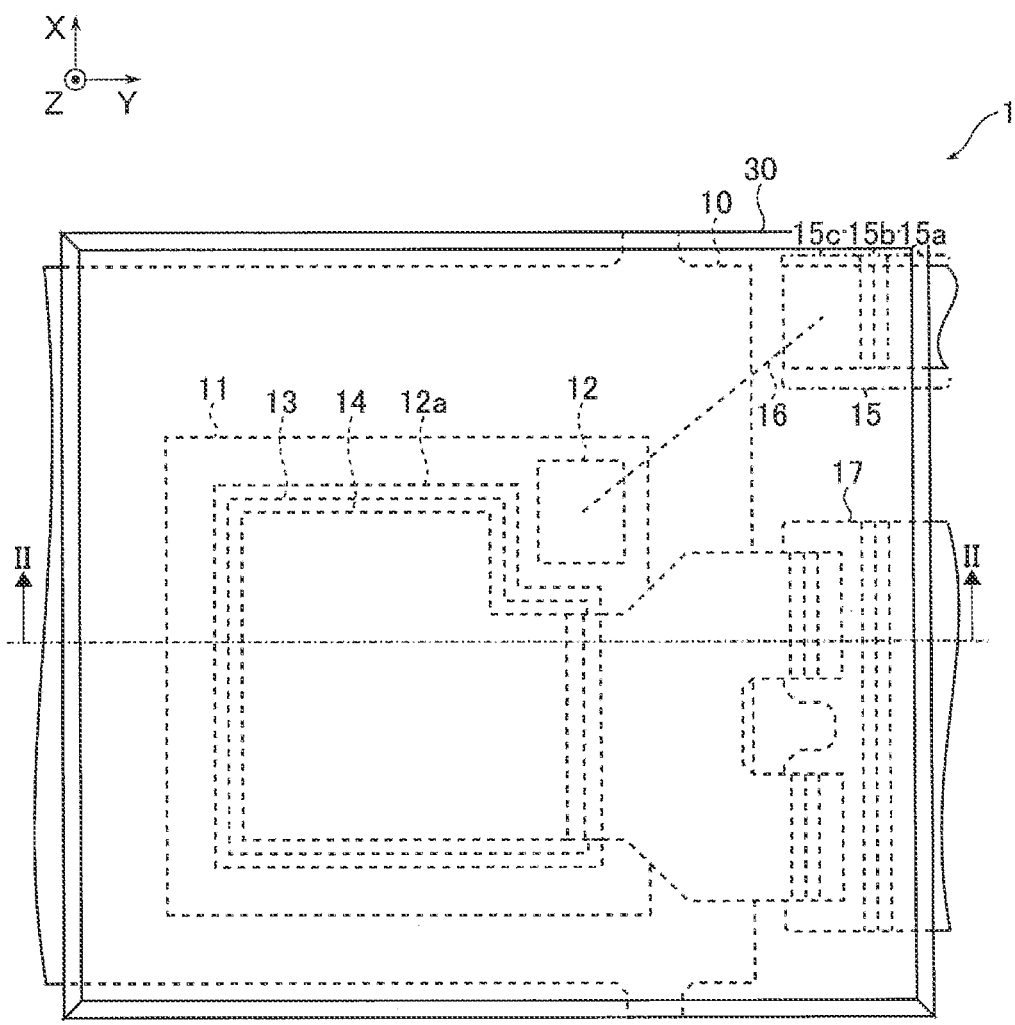
FIG. 10 is a plan view showing an example of a configuration of a semiconductor device according to a second embodiment.
Figure 11:
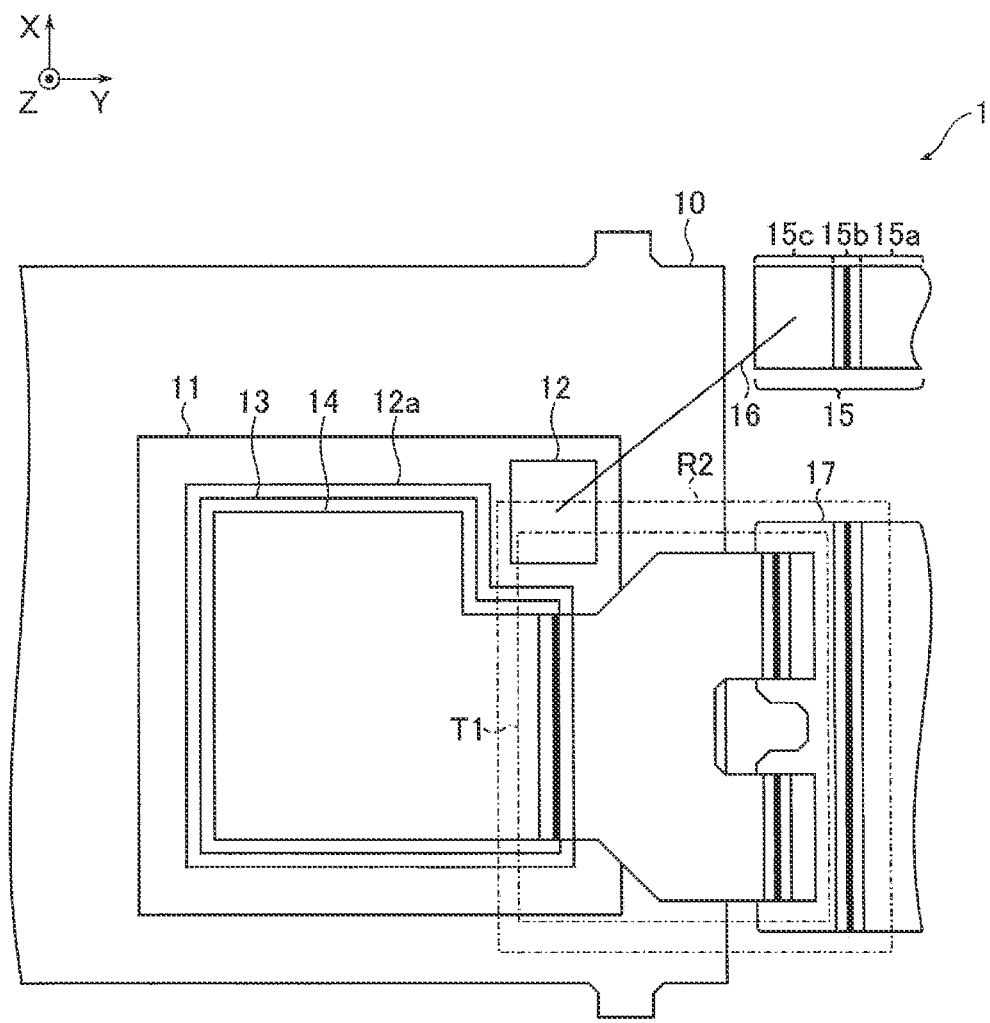
FIG. 11 is a plan view showing an example of an internal configuration of the semiconductor device according to the second embodiment.

The configuration of the semiconductor device 1 according to the present embodiment will be described with reference to FIG. 10 and FIG. 11. FIG. 10 is a plan view showing an example of a configuration of the semiconductor device 1. In the example shown in FIG. 10, a resin is indicated by the solid line. The internal constituent elements covered with the resin are indicated by the broken line. The outside of the resin is indicated by the solid line. FIG. 11 is a plan view showing an example of the internal configuration of the semiconductor device 1. The example shown in FIG. 11 omits the resin.

As shown in FIG. 10, the semiconductor device 1 includes the lead frame 10, the chip 11, the electrode 12, the electrode 12a, the joint member 13, the joint terminal 14, the electrode terminal 15, the interconnect 16, the electrode terminal 17, and the resin 30.

Part of the lead frame 10, all of the chip 11, all of the electrode 12, all of the electrode 12a, all of the joint member 13, all of the joint terminal 14, part of the electrode terminal 15, all of the interconnect 16, and part of the electrode terminal 17 are covered with the resin 30.

As shown in FIG. 11, the lead frame 10 is formed into, for example, a plate shape. The end far from the electrode terminal 17 of ends in the Y direction of the lead frame 10 extends in the Y direction.

The chip 11 is provided on the lead frame 10.

The electrode 12a is formed into, for example, a substantially letter L shape when viewed from a top (when viewed from the top of the drawing sheet of FIG. 11). The electrode 12a is provided on the chip 11.

The joint member 13 is formed into, for example, a substantially letter L shape when viewed from the top. The joint member 13 is provided on the electrode 12a. The joint member 13 electrically couples the electrode 12a to the joint terminal 14.

The joint terminal 14 is formed into, for example, a substantially letter L shape when viewed from the top. The joint terminal 14 is provided on the joint member 13. The joint terminal 14 will be described later in detail.

The electrode terminal 17 is spaced apart from the electrode terminal 15 in the X direction. The electrode terminal 17 is spaced apart from the lead frame 10 in the Y direction. The end far from the lead frame 10 of ends in the Y direction of the electrode terminal 17 extends in the Y direction. The electrode terminal 17 will be described later in detail.

Figure 12:
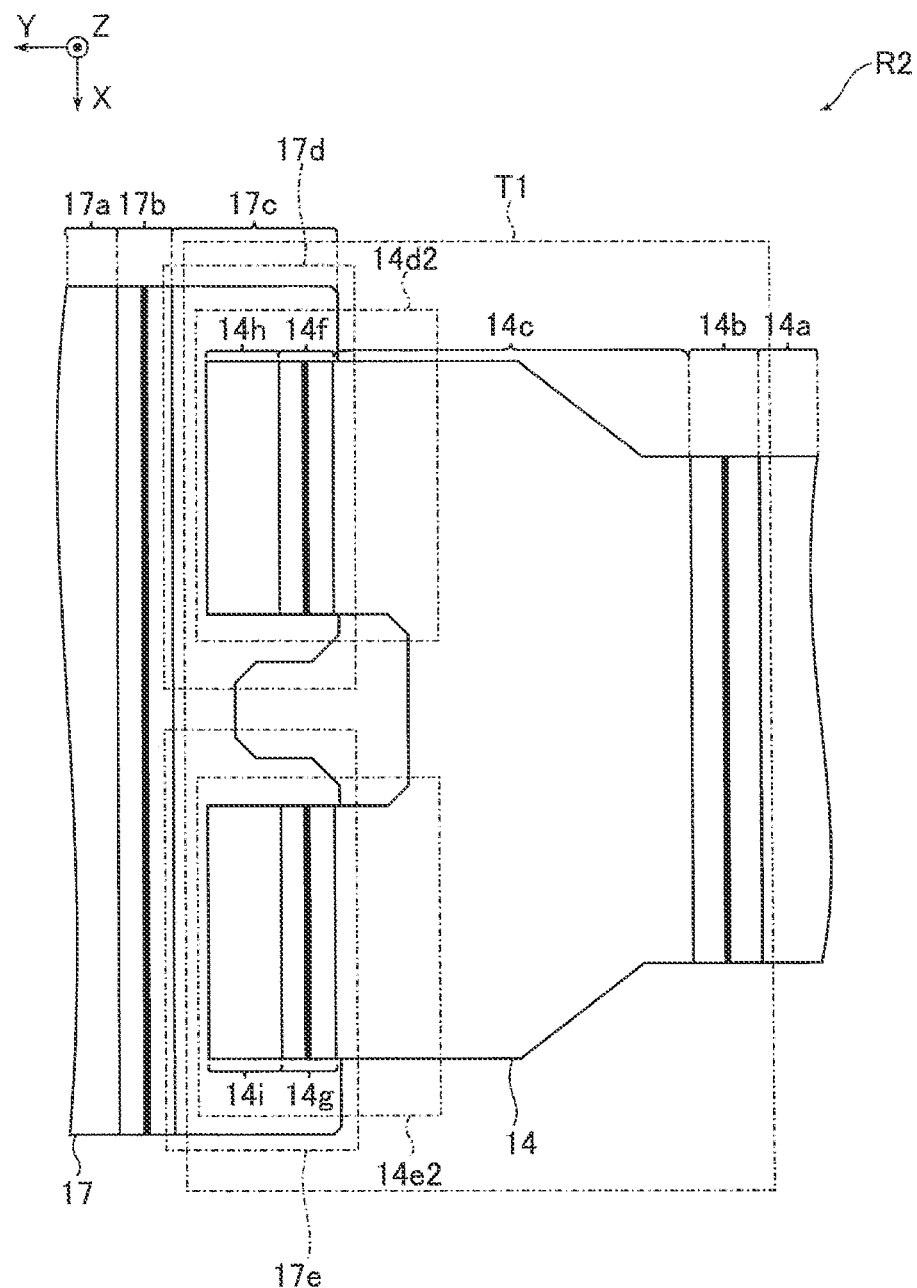
FIG. 12 is an enlarged view showing some of the internal configuration of the semiconductor device according to the second embodiment.

The joint terminal 14 will be described in detail with reference to FIG. 12. FIG. 12 is an enlarged view showing some of the internal configuration of the semiconductor device 1 (the enlarged view of the region R2 in FIG. 11). The example shown in FIG. 12 omits the chip 11, the electrodes 12 and 12a, and the joint member 13.

As shown in FIG. 12, the joint terminal 14 includes a base portion 14a and a terminal portion T1. The terminal portion T1 is positioned on a side close to the electrode terminal 17 in the Y direction of the joint terminal 14. The terminal portion T1 extends toward the electrode terminal 17. The terminal portion T1 is formed into, for example, a substantially letter Y shape when viewed from the top. The terminal portion T1 includes the bending portion 14b, the bridge portion 14c, bending portions 14f and 14g, and joint portions 14h and 14i.

For example, the joint terminal 14 is bent upward on the boundary between the base portion 14a and the bending portion 14b, and is bent in the Y direction on the boundary between the bending portion 14b and the bridge portion 14c. For example, the joint terminal 14 is bent downward on the boundary between the bridge portion 14c and the bending portion 14f, and is bent in the Y direction on the boundary between the bending portion 14f and the joint portion 14h. For example, the joint terminal 14 is bent downward on the boundary between the bridge portion 14c and the bending portion 14g, and is bent in the Y direction on the boundary between the bending portion 14g and the joint portion 14i. The surface of the base portion 14a, the surface of the bridge portion 14c, the surface of the joint portion 14h, and the surface of the joint portion 14i are substantially parallel to each other. The surface of the bridge portion 14c is positioned above the surface of the base portion 14a, the surface of the joint portion 14h, and the surface of the joint portion 14i. In other words, the joint terminal 14 has a step in the Y direction.

The terminal portion T1 includes projecting portions 14d2 and 14e2 each of which projects toward the electrode terminal 17. In other words, the end close to the electrode terminal 17 of ends in the Y direction of the terminal portion T1 is divided into two parts. The projecting portions 14d2 and 14e2 are spaced apart from each other in the X direction. The projecting portion 14d2 includes part of the bridge portion 14c, all of the bending portion 14f, and all of the joint portion 14h. The projecting portion 14e2 includes part of the bridge portion 14c, all of the bending portion 14g, and all of the joint portion 14i. The terminal portion T1 may include three or more projecting portions. In this case, these projecting portions are spaced apart from each other in the X direction.

The electrode terminal 17 will be described in detail with reference to FIG. 12.

As shown in FIG. 12, the electrode terminal 17 is formed into, for example, a substantially letter U shape when viewed from the top. The electrode terminal 17 includes a base portion 17a, a bending portion 17b, and a joint portion 17c.

For example, the electrode terminal 17 is bent upward on the boundary between the base portion 17a and the bending portion 17b, and is bent in the Y direction on the boundary between the bending portion 17b and the joint portion 17c. The surface of the base portion 17a and the surface of the joint portion 17c are substantially parallel to each other. The surface of the joint portion 17c is positioned above the surface of the base portion 17a. In other words, the electrode terminal 17 has a step in the Y direction.

The electrode terminal 17 includes the projecting portions 17d and 17e each of which projects toward the joint terminal 14 (toward the lead frame 10). In other words, the end close to the joint terminal 14 of ends in the Y direction of the electrode terminal 17 is divided into two parts. The projecting portions 17d and 17e are spaced apart from each other in the X direction. The electrode terminal 17 may include three or more projecting portions. In this case, these projecting portions are spaced apart from each other in the X direction.

As shown in FIG. 12, the end portion of the terminal portion T1 is provided on the electrode terminal 17. More specifically, the joint portion 14h of the terminal portion T1 is joined on the joint portion 17c of the electrode terminal 17. The joint portion 14i of the terminal portion T1 is joined on the joint portion 17c of the electrode terminal 17. In other words, the end portion of the projecting portion 14d2 of the terminal portion T1 is joined on the projecting portion 17d of the electrode terminal 17. The end portion of the projecting portion 14e2 of the terminal portion T1 is joined on the projecting portion 17e of the electrode terminal 17. That is, the terminal portion T1 and the electrode terminal 17 are joined together via two joint surfaces. Hereinafter, a combination of the joint surfaces, the end portion of the terminal portion T1 in contact with the joint surfaces, and the end portion of the electrode terminal 17 in contact with the joint surfaces will be referred to as a "joint part". This electrically couples the terminal portion T1 to the electrode terminal 17. In other words, the joint terminal 14 is electrically coupled to the electrode terminal 17 with the terminal portion T1 intervening therebetween.

The lead frame 10 and the electrode terminals 15 and 17 shown in FIG. 11 correspond to part of a lead frame (not shown), and also correspond to the remainder of the lead frame (not shown) cut and removed through a manufacturing process.

Figure 13:
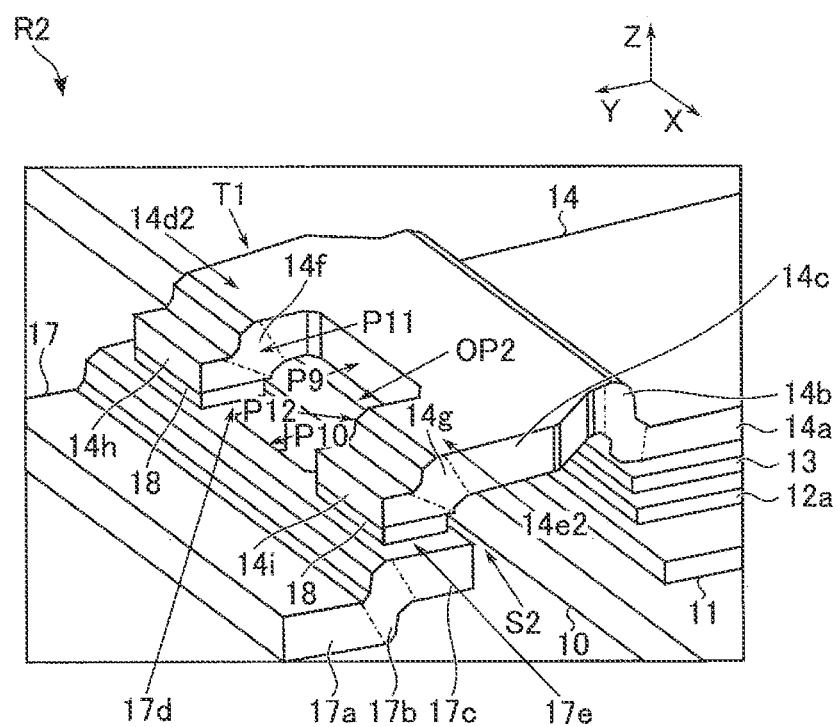
FIG. 13 is a perspective view showing some of the internal configuration of the semiconductor device according to the second embodiment.

FIG. 13 is a perspective view (the perspective view of the region R2 in FIG. 11) showing some of the internal configuration of the semiconductor device 1. The example shown in FIG. 13 omits the electrode 12.

As shown in FIG. 13, the end portion of the projecting portion 14d2 is provided on the projecting portion 17d. The end portion of the projecting portion 14d2 is joined on the projecting portion 17d via the joint member 18 formed on the upper surface of the projecting portion 17d. The joint member 18 is, for example, a solder joint. The joint member 18 electrically couples the terminal portion T1 to the electrode terminal 17. The end portion of the projecting portion 14e2 is provided on the projecting portion 17e. The end portion of the projecting portion 14e2 is joined on the projecting portion 17e via a joint member 18 formed on the upper surface of the projecting portion 17e.

An end surface of the terminal portion T1 (the surface of the terminal portion T1, the surface being sandwiched between the projecting portions 14d2 and 14e2 and facing the electrode terminal 17 (this surface will be also referred to as a "surface P9")) is positioned closer to the lead frame 10 as compared to an end surface of the electrode terminal 17 (the surface of the electrode terminal 17, the surface being sandwiched between the projecting portions 17d and 17e and facing the lead frame 10 (this surface will be also referred to as a "surface P10")).

With the above structure, an upper part of a space (hereinafter, also referred to as a "space S2") surrounded by the electrode terminal 17, the joint member 18, the terminal portion T1, the joint member 13, the electrode 12a, the chip 11, and the lead frame 10 is not blocked by the terminal portion T1 and the electrode terminal 17. While the projecting portion 14d2 has a surface which faces the projecting portion 14e2 and is referred to as a "surface P11" and the projecting portion 14e2 has a surface which faces the projecting portion 14d2 and is referred to as a "surface P12", the semiconductor device 1 has a region surrounded by the surfaces P9, P10, P11, and P12. In other words, the terminal portion T1 and the electrode terminal 17 (the projecting portions 14d2, 14e2, 17d, and 17e) form an opening (hereinafter, also referred to as an "opening OP2"). That is, the semiconductor device 1 has the opening OP2 formed by the terminal portion T1 and the electrode terminal 17. A region surrounded by the surfaces P9, P10, P11, and P12 corresponds to the opening OP2. Both ends in the X direction of the space S2 are not blocked.

A cross-sectional structure of the semiconductor device 1 will be described with reference to FIG. 14. FIG. 14 is a cross-sectional view (the cross-sectional view taken along the line II-II in FIG. 10) showing an example of a structure of the semiconductor device 1.

As shown in FIG. 14, the bending portion 17b enables the electrode terminal 17 to be bent in such a manner that the surface of the joint portion 17c is positioned above the surface of the base portion 17a.

The chip 11 is provided on the lead frame 10. The electrode 12a is provided on the chip 11. The joint member 13 is provided on the electrode 12a. The joint terminal 14 is provided on the joint member 13. The bending portions 14b and 14g enable the joint terminal 14 to be bent in such a manner that the surface of the bridge portion 14c is positioned above the surface of the base portion 14a and the surface of the joint portion 14i.

The joint portion 14i is provided on the joint portion 17c. The joint portion 14i is joined on the joint portion 17c via the joint member 18.

The lead frame 10, the chip 11, the electrode 12a, the joint member 13, the joint terminal 14, and the electrode terminal 17 are covered with the resin 30. The space S2 is filled with the resin 30.

2.2 Advantageous Effect of Present Embodiment

In the present embodiment, the terminal portion T1 has a configuration similar to that of the terminal portion T3 in the first embodiment. The electrode terminal 17 has a configuration similar to that of the terminal portion T2 in the first embodiment. The terminal portion T1 and the electrode terminal 17 are joined together in a similar manner to the terminal portion T2 and the terminal portion T3 joined together in the first embodiment. As with the first embodiment, this can suppress the strain of the joint part between the terminal portion T1 and the electrode terminal 17 and also suppress the occurrence of peeling between the terminal portions T1 and the electrode terminal 17 at the joint part.

In the present embodiment, the semiconductor device 1 has the opening OP2 formed by the terminal portion T1 and the electrode terminal 17. Accordingly, during the formation process of the resin 30, when the resin 30 is injected from the X direction side, the resin 30 not only flows directly into the space S2 but also travels downward through the opening OP2 to flow into the space S2. As with the first embodiment, this can improve the filling property of the resin 30.

Furthermore, as with the first embodiment, the present embodiment can suppress peeling between the terminal portion T1 and the resin 30 and peeling between the electrode terminal 17 and the resin 30.

As described above, the configuration according to the present embodiment can improve the yield of the semiconductor device, as with the first embodiment.

2.3 First Modification

A semiconductor device according to a first modification of the second embodiment will be described. The semiconductor device 1 according to the first modification of the second embodiment differs from that of the second embodiment in terms of a shape of the electrode terminal 17. The following will omit a description of a configuration similar to that of the second embodiment and will mainly provide a description of a configuration different from that of the second embodiment.

2.3.1 Configuration of Semiconductor Device

Figure 15:
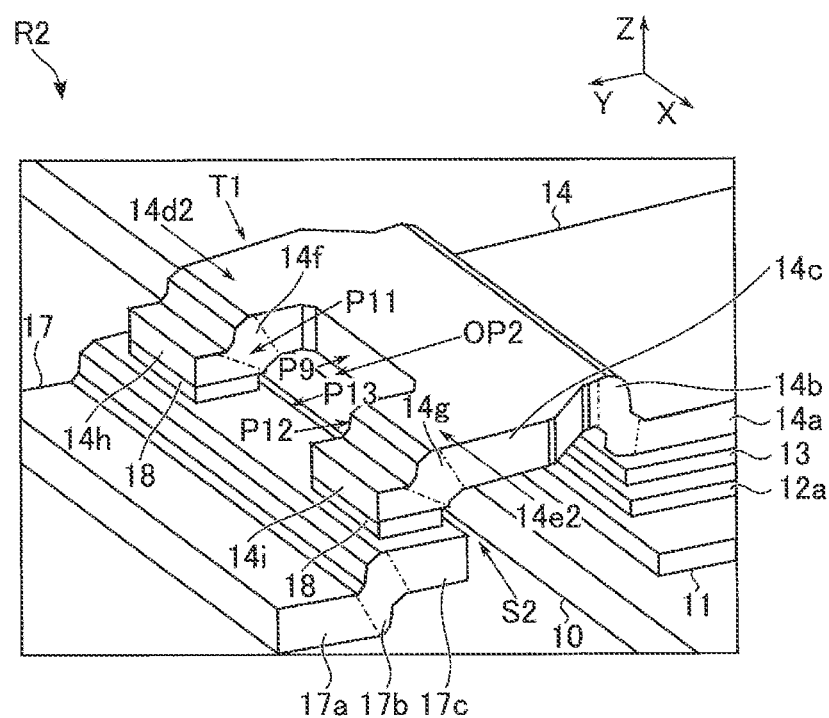
FIG. 15 is a perspective view showing some of an internal configuration of a semiconductor device according to a first modification of the second embodiment.

The configuration of the semiconductor device 1 according to the present modification will be described with reference to FIG. 15. FIG. 15 is a perspective view showing some of the internal configuration of the semiconductor device 1 (the view corresponding to FIG. 13 showing the second embodiment). The example shown in FIG. 15 omits the electrode 12.

As shown in FIG. 15, the electrode terminal 17 is formed into, for example, a substantially rectangular shape when viewed from the top. The end close to the joint terminal 14 of ends in the Y direction of the electrode terminal 17 is not divided into two or more parts.

The end portion of the projecting portion 14d2 is joined on the electrode terminal 17. More specifically, the end portion of the projecting portion 14d2 is joined on the electrode terminal 17 via the joint member 18 formed on the upper surface of the electrode terminal 17. The end portion of the projecting portion 14e2 is joined on the electrode terminal 17. More specifically, the end portion of the projecting portion 14e2 is joined on the electrode terminal 17 via the joint member 18 formed on the upper surface of the electrode terminal 17. That is, the terminal portion T1 and the electrode terminal 17 are joined together via two joint surfaces.

An end surface of the terminal portion T1 (the surface P9 of the terminal portion T1, the surface being sandwiched between the projecting portions 14d2 and 14e2 and facing the electrode terminal 17) is positioned closer to the lead frame 10 as compared to an end surface of the electrode terminal 17 (the surface of the electrode terminal 17, the surface facing the lead frame 10 (this surface will be also referred to as a "surface P13")).

With the above structure, the upper part of the space S2 is not blocked by the terminal portion T1 and the electrode terminal 17. The semiconductor device 1 includes a region surrounded by the surfaces P9, P11, P12, and P13. In other words, the terminal portion T1 and the electrode terminal 17 (the projecting portions 14d2 and 14e2 and the electrode terminal 17) form the opening OP2. That is, the semiconductor device 1 has the opening OP2 formed by the terminal portion T1 and the electrode terminal 17. A region surrounded by the surfaces P9, P11, P12, and P13 corresponds to the opening OP2. Both ends in the X direction of the space S2 are not blocked.

2.3.2 Advantageous Effect of Present Modification

The present modification produces advantageous effects similar to those of the second embodiment.

2.4 Second Modification

A semiconductor device according to a second modification of the second embodiment will be described. The semiconductor device 1 according to the second modification of the second embodiment differs from that of the second embodiment in terms of a shape of the terminal portion T1 of the joint terminal 14. The following will omit a description of a configuration similar to that of the second embodiment and will mainly provide a description of a configuration different from that of the second embodiment.

2.4.1 Configuration of Semiconductor Device

The configuration of the semiconductor device 1 according to the present modification will be described with reference to FIG. 16. FIG. 16 is a perspective view showing some of the internal configuration of the semiconductor device 1 (the view corresponding to FIG. 13 showing the second embodiment). The example shown in FIG. 16 omits the electrode 12.

As shown in FIG. 16, the terminal portion T1 is formed into, for example, a substantially rectangular shape when viewed from the top. The terminal portion T1 includes the bending portion 14b, the bridge portion 14c, a bending portion 14j, and a joint portion 14k.

For example, the joint terminal 14 is bent upward on the boundary between the base portion 14a and the bending portion 14b, and is bent in the Y direction on the boundary between the bending portion 14b and the bridge portion 14c. For example, the joint terminal 14 is bent downward on the boundary between the bridge portion 14c and the bending portion 14j, and is bent in the Y direction on the boundary between the bending portion 14j and the joint portion 14k. The surface of the base portion 14a, the surface of the bridge portion 14c, and the surface of the joint portion 14k are substantially parallel to each other. The surface of the bridge portion 14c is positioned above the surface of the base portion 14a and the surface of the joint portion 14k. In other words, the joint terminal 14 has a step in the Y direction.

The end close to the electrode terminal 17 of ends in the Y direction of the terminal portion T1 is not divided into two or more parts.

The end portion of the terminal portion T1 is joined on the projecting portion 17d. More specifically, the end portion of the terminal portion T1 is joined on the projecting portion 17d via the joint member 18 formed on the upper surface of the projecting portion 17d. The end portion of the terminal portion T1 is joined on the projecting portion 17e. More specifically, the end portion of the terminal portion T1 is joined on the projecting portion 17e via the joint member 18 formed on the upper surface of the projecting portion 17e.

That is, the terminal portion T1 and the electrode terminal 17 are joined together via two joint surfaces.

An end surface of the terminal portion T1 (the surface of the terminal portion T1, the surface facing the electrode terminal 17 (this surface will be also referred to as a "surface P14")) is positioned closer to the lead frame 10 as compared to an end surface of the electrode terminal 17 (the surface P10 of the electrode terminal 17, the surface P10 being sandwiched between the projecting portions 17d and 17e and facing the lead frame 10).

With the above structure, the upper part of the space S2 is not blocked by the terminal portion T1 and the electrode terminal 17. While the projecting portion 17d has a surface which faces the projecting portion 17e and is referred to as a "surface P15" and the projecting portion 17e has a surface which faces the projecting portion 17d and is referred to as a "surface P16", the semiconductor device 1 has a region surrounded by the surfaces P10, P14, P15, and P16. In other words, the terminal portion T1 and the electrode terminal 17 (the terminal portion T1 and the projecting portions 17d and 17e) form the opening OP2. That is, the semiconductor device 1 has the opening OP2 formed by the terminal portion T1 and the electrode terminal 17. A region surrounded by the surfaces P10, P14, P15, and P16 corresponds to the opening OP2. Both ends in the X direction of the space S2 are not blocked.

2.4.2 Advantageous Effect of Present Modification

The present modification produces advantageous effects similar to those of the second embodiment.

3. MODIFICATIONS, ETC

As described above, a semiconductor device (1) according to an embodiment includes: a first frame (10); a first chip (11) provided on the first frame; a second frame (20) spaced apart from the first frame in a first direction (X); a second chip (21) provided on the second frame; and a first joint terminal (24) provided above the second chip and electrically coupled to the second chip. The first frame (10) includes a first terminal portion (T2) extending toward the second frame (20). The first joint terminal (24) includes a second terminal portion (T3) extending toward the first frame (10). The second terminal portion (T3) includes a first projecting portion (24d) and a second projecting portion (24e) each of which projects toward the first frame (10) and which are spaced apart from each other in a second direction (Y) intersecting the first direction (X). An end portion of the first projecting portion (24d) and an end portion of the second projecting portion (24e) are each joined on the first terminal portion (T2).

The embodiments are not limited to those described in the above, and various modifications can be made.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first frame;
a first chip provided on the first frame;
a second frame spaced apart from the first frame in a first direction;
a second chip provided on the second frame; and
a first joint terminal provided above the second chip and electrically coupled to the second chip,
wherein the first frame includes a first terminal portion extending toward the second frame,
the first joint terminal includes a second terminal portion extending toward the first frame,
the second terminal portion includes a first projecting portion and a second projecting portion each of which projects toward the first frame in the first direction and which are spaced apart from each other in a second direction intersecting the first direction,
an end portion of the first projecting portion and an end portion of the second projecting portion are each joined on the first terminal portion,
the first terminal portion includes a third projecting portion and a fourth projecting portion each of which projects toward the second frame in the first direction and which are spaced apart from each other in the second direction,
an end portion of the first projecting portion is joined on the third projecting portion,
an end portion of the second projecting portion is joined on the fourth projecting portion,
a length of the third projecting portion is longer than a length of the first projecting portion in the second direction,
a length of the fourth projecting portion is longer than a length of the second projecting portion in the second direction, and
an end portion of the third projecting portion and an end portion of the fourth projecting portion are each positioned closer to the first frame as compared to a first surface of the second terminal portion, the first surface being sandwiched between the first projecting portion and the second projecting portion and facing the first frame.

2. The device according to claim 1, wherein the first surface of the second terminal portion is positioned closer to the second frame as compared to a second surface of the first terminal portion, the second surface facing the second frame.

3. The device according to claim 2, further comprising a region surrounded by the first surface of the second terminal portion, the second surface of the first terminal portion, a third surface of the first projecting portion, the third surface facing the second projecting portion, and a fourth surface of the second projecting portion, the fourth surface facing the first projecting portion.

4. The device according to claim 2, wherein
the second surface of the first terminal portion is sandwiched between the third projecting portion and the fourth projecting portion.

5. The device according to claim 4, further comprising an opening formed by the first projecting portion, the second projecting portion, the third projecting portion, and the fourth projecting portion.

6. The device according to claim 1, further comprising an opening formed by the first terminal portion and the second terminal portion.

7. The device according to claim 6, wherein the opening is formed by the first projecting portion, the second projecting portion, and the first terminal portion.

8. A semiconductor device comprising:
a first frame;
a first chip provided on the first frame;
a first joint terminal provided above the first chip and electrically coupled to the first chip; and
an electrode terminal spaced apart from the first frame in a first direction,
wherein the first joint terminal includes a first terminal portion extending toward the electrode terminal,
the first terminal portion includes a first projecting portion and a second projecting portion each of which projects toward the electrode terminal in the first direction and which are spaced apart from each other in a second direction intersecting the first direction,
an end portion of the first projecting portion and an end portion of the second projecting portion are each joined on the electrode terminal,
the electrode terminal includes a third projecting portion and a fourth projecting portion each of which projects toward the first frame in the first direction and which are spaced apart from each other in the second direction,
an end portion of the first projecting portion is joined on the third projecting portion,
an end portion of the second projecting portion is joined on the fourth projecting portion,
a length of the third projecting portion is longer than a length of the first projecting portion in the second direction,
a length of the fourth projecting portion is longer than a length of the second projecting portion in the second direction, and
an end portion of the third projecting portion and an end portion of the fourth projecting portion are each positioned closer to the electrode terminal as compared to a first surface of the first terminal portion, the first surface being sandwiched between the first projecting portion and the second projecting portion and facing the electrode terminal.

9. The device according to claim 8, wherein the first surface of the first terminal portion is positioned closer to the first frame as compared to a second surface of the electrode terminal, the second surface facing the first frame.

10. The device according to claim 9, further comprising a region surrounded by the first surface of the first terminal portion, the second surface of the electrode terminal, a third surface of the first projecting portion, the third surface facing the second projecting portion, and a fourth surface of the second projecting portion, the fourth surface facing the first projecting portion.

11. The device according to claim 9, wherein
the second surface of the electrode terminal is sandwiched between the third projecting portion and the fourth projecting portion.

12. The device according to claim 11, further comprising an opening formed by the first projecting portion, the second projecting portion, the third projecting portion, and the fourth projecting portion.

13. The device according to claim 8, further comprising an opening formed by the first terminal portion and the electrode terminal.

14. The device according to claim 13, wherein the opening is formed by the first projecting portion, the second projecting portion, and the electrode terminal.

15. A semiconductor device comprising:
a first frame;
a first chip provided on the first frame;
a second frame spaced apart from the first frame in a first direction;
a second chip provided on the second frame; and
a first joint terminal provided above the second chip and electrically coupled to the second chip,
wherein the first frame includes a first terminal portion extending toward the second frame,
the first joint terminal includes a second terminal portion extending toward the first frame,
the second terminal portion includes a first projecting portion and a second projecting portion each of which projects toward the first frame in the first direction and which are spaced apart from each other in a second direction intersecting the first direction,
an end portion of the first projecting portion and an end portion of the second projecting portion are each joined on the first terminal portion,
the first terminal portion includes a third projecting portion and a fourth projecting portion each of which projects toward the second frame in the first direction and which are spaced apart from each other in the second direction,
an end portion of the first projecting portion is joined on the third projecting portion,
an end portion of the second projecting portion is joined on the fourth projecting portion,
an opening is formed by the first projecting portion, the second projecting portion, the third projecting portion, and the fourth projecting portion, and
an upper surface of the first projecting portion, an upper surface of the second projecting portion, a lower surface of the third projecting portion, a lower surface of the fourth projecting portion, and the opening are in contact with a resin.

* * * * *